US011294169B2

(12) United States Patent
Sakurai (10) Patent No.: US 11,294,169 B2
(45) Date of Patent: Apr. 5, 2022

(54) SCANNING DEVICE (71) Applicant: HAMAMATSU PHOTONICS K.K., Hamamatsu (JP)

(72) Inventor: Naoto Sakurai, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 61 days.

(21) Appl. No.: 16/632,958

(22) PCT Filed: Jul. 23, 2018

(86) PCT No.: PCT/JP2018/027518
§ 371 (c)(1),
(2) Date: Jan. 22, 2020

(87) PCT Pub. No.: WO2019/022014
PCT Pub. Date: Jan. 31, 2019

(65) Prior Publication Data
US 2020/0159008 A1 May 21, 2020

(30) Foreign Application Priority Data
Jul. 25, 2017 (JP) .............................. JP2017-143599

(51) Int. Cl.
*G02B 26/08* (2006.01)
*G02B 26/10* (2006.01)
*H04N 9/31* (2006.01)

(52) U.S. Cl.
CPC ......... *G02B 26/101* (2013.01); *G02B 26/085* (2013.01); *G02B 26/105* (2013.01); *H04N 9/3135* (2013.01)

(58) Field of Classification Search
CPC .. G02B 26/101; G02B 26/085; G02B 26/105; H04N 9/3135; B81B 3/00
(Continued)

(56) References Cited

U.S. PATENT DOCUMENTS 6,049,407 A * 4/2000 Melville ............ G02B 26/0858
359/198.1
8,576,468 B2 * 11/2013 Freeman .............. G02B 26/101
359/202.1
2014/0333979 A1 11/2014 Huang et al.

FOREIGN PATENT DOCUMENTS

CN 104181761 A 12/2014
JP 2006-276634 A 10/2006
(Continued)

OTHER PUBLICATIONS

International Preliminary Report on Patentability dated Feb. 6, 2020 for PCT/JP2018/027518.

*Primary Examiner* — Euncha P Cherry
(74) *Attorney, Agent, or Firm* — Faegre Drinker Biddle & Reath LLP (57) ABSTRACT A scanning device includes an MEMS mirror mechanism that swings a mirror with respect to a first axial line as a central line and swings the mirror with respect to a second axial line as a central line, and a control unit that generates a first drive signal for swinging the mirror with respect to the first axial line, and a second drive signal for swinging the mirror with respect to the second axial line. The control unit generates the first drive signal and the second drive signal so that m times of reciprocation of an irradiation region in a first direction and one time of reciprocation of the irradiation region in a second direction correspond to each other by repeating generation of a second signal element constituting the second drive signal to correspond to a first signal element in a period equal to or less than one cycle in the first drive signal.

24 Claims, 8 Drawing Sheets (58) Field of Classification Search
USPC .................................................... 359/199.3
See application file for complete search history.

(56) References Cited

FOREIGN PATENT DOCUMENTS

| | | |
|---|---|---|
| JP | 2009-198988 A | 9/2009 |
| TW | 201345642 A | 11/2013 |
| WO | WO 2013/148770 A1 | 10/2013 |
| WO | WO-2014/132447 A1 | 9/2014 |

\* cited by examiner

SCANNING DEVICE

TECHNICAL FIELD

The present disclosure relates to a scanning device.

BACKGROUND ART

As a scanning device, for example, a scanning device that performs scanning with laser light by using a MEMS (micro electro mechanical systems) mirror mechanism to display an image is known.

In the scanning device, for example, an image of one frame or two frames is formed by m times of reciprocation (m: an integer of two or greater) of an irradiation region of laser light in a horizontal direction, and one time of reciprocation of the irradiation region of the laser light in a vertical direction. Patent Literature 1 discloses a technology in which synchronization is performed at the time of initiating one frame and at the time of terminating one frame between a horizontal drive signal and a vertical drive signal for driving the MEMS mirror mechanism.

CITATION LIST

Patent Literature

Patent Literature 1: Japanese Unexamined Patent Publication No. 2006-276634

SUMMARY OF INVENTION

Technical Problem

However, for example, in a case where a mirror is caused to be resonated by the horizontal drive signal, when a resonance frequency of the mirror varies in one frame due to a variation of an ambient temperature or the like, in the technology described in Patent Literature 1, it is difficult to correct a deviation that occurs in a corresponding relationship between the horizontal drive signal and the vertical drive signal until the one frame is terminated, and as a result, there is a concern that display of an image may be unstable.

An object of the present disclosure is to provide a scanning device capable of realizing stable scanning with laser light.

Solution to Problem

A scanning device according to an aspect of the present disclosure includes: a light source that emits laser light; an MEMS mirror mechanism that includes a mirror that reflects the laser light emitted from the light source, reciprocates an irradiation region of the laser light in a first direction by swinging the mirror with respect to a first axial line as a central line, and reciprocates the irradiation region in a second direction that intersects the first direction by swinging the mirror with respect to a second axial line as a central line that intersects the first axial line; and a control unit that generates a first drive signal for swinging the mirror with respect to the first axial line as a central line and a second drive signal for swinging the mirror with respect to the second axial line as a central line, and inputs the first drive signal and the second drive signal to the MEMS mirror mechanism. The first drive signal is an electric signal in which one swing of the mirror with respect to the first axial line as a central line is set as one cycle, the second drive signal is an electric signal in which one swing of the mirror with respect to the second axial line as a central line is set as one cycle, and the control unit generates a second signal element constituting the second drive signal to correspond to a first signal element in a period equal to or less than one cycle period in the first drive signal, and repeats generation of the second signal element in both an outgoing period and an incoming period in the one swing of the mirror with respect to the second axial line as a central line to generate the first drive signal and the second drive signal so that m times of reciprocation (m: an integer of two or greater) of the irradiation region in the first direction and one time of reciprocation of the irradiation region in the second direction correspond to each other.

In the scanning device, the second signal element constituting the second drive signal is generated to correspond to the first signal element in a period equal to or less than one cycle period in the first drive signal. In addition, generation of the second signal element is repeated in both an outgoing period and an incoming period in the one swing of the mirror with respect to the second axial line as a central line. According to this, even when the MEMS mirror mechanism is influenced by a variation of an ambient temperature or the like, it is possible to suppress occurrence of a deviation in a corresponding relationship between the first drive signal and the second drive signal. Accordingly, according to the scanning device, stable scanning with laser light becomes possible.

In the scanning device according to the aspect of the present disclosure, the first drive signal may be an electric signal for resonating the mirror with respect to the first axial line as a central line, the second drive signal may be an electric signal for linearly operating the mirror with respect to the second axial line as a central line, and the control unit may modulate a frequency of the first drive signal to conform to a resonance frequency of the mirror. According to this, even when the resonance frequency of the mirror varies due to a variation of an ambient temperature or the like, it is possible to more reliably suppress occurrence of a deviation in a corresponding relationship between the first drive signal and the second drive signal.

In the scanning device according to the aspect of the present disclosure, the control unit may control the light source so that the outgoing period corresponds to a lighting-on period and the incoming period corresponds to a lighting-off period, and may repeat generation of the second signal element in the both lighting-on period and the lighting-off period. According to this, it is possible to suppress occurrence of a deviation in a corresponding relationship between the first drive signal and the second drive signal in the respective lighting-on periods. Note that, the lighting-on period is a period in which the control unit causes the light source to emit laser light, and the lighting-off period is a period in which the control unit does not cause the light source to emit the laser light.

In the scanning device according to the aspect of the present disclosure, the control unit may control the light source so that the outgoing period corresponds to a first lighting-on period and the incoming period corresponds to a second lighting-on period, and may repeat generation of the second signal element in both the first lighting-on period and the second lighting-on period. According to this, it is possible to suppress occurrence of the deviation in the corresponding relationship between the first drive signal and the second drive signal in the first lighting-on period and the second lighting-on period. Note that, the first lighting-on period and the second lighting-on period are periods in which the control unit causes the light source to emit laser light.

In the scanning device according to the aspect of the present disclosure, the control unit may generate the second signal element to correspond to the first signal element in a ½ cycle period in the first drive signal. Alternatively, the control unit may generate the second signal element to correspond to the first signal element in a one cycle period in the first drive signal. According to this, it is possible to make a process when generating the second signal element easy.

In the scanning device according to the aspect of the present disclosure, the control unit may generate the second signal element to correspond to the first signal element in a current one cycle period in the first drive signal. Alternatively, the control unit may generate the second signal element to correspond to the first signal element in an immediately previous one cycle period in the first drive signal. According to this, time delay when generating the second signal element can be minimized.

In the scanning device according to the aspect of the present disclosure, the MEMS mirror mechanism may include a first movable unit provided with the mirror, a second movable unit that supports the first movable unit to be swingable with respect to the first axial line as a central line, a support unit that supports the second movable unit to be swingable with respect to the second axial line as a central line, a drive coil that is provided in the second movable unit, and a magnet that generates a magnetic field acting on the drive coil. The electromagnetic drive type MEMS mirror mechanism is susceptible to a variation of an ambient temperature or the like, and thus repetition of generation of the second signal element as described above is particularly effective.

In the scanning device according to the aspect of the present disclosure, the light source may emit the laser light for projection display, and the control unit may generate the first drive signal and the second drive signal so that an image of one frame or two frames is formed by the m times of reciprocation of the irradiation region in the first direction and the one time of reciprocation of the irradiation region in the second direction. As described above, it is possible to suppress occurrence of a deviation in the corresponding relationship between the first drive signal and the second drive signal, and thus, in this case, stable image display is possible.

In the scanning device according to the aspect of the present disclosure, the control unit may control the light source so that the laser light is modulated in correspondence with a position of the irradiation region. According to this, image display with higher quality is possible.

In the scanning device according to the aspect of the present disclosure, the control unit may repeat generation of the second signal element while fluctuating a frame rate. According to this, it is possible to easily and reliably repeat generation of the second signal element.

Advantageous Effects of Invention

According to the present disclosure, it is possible to provide a scanning device capable of realizing stable scanning with laser light.

DESCRIPTION OF EMBODIMENTS

Hereinafter, an embodiment of the present disclosure will be described in detail with reference to the accompanying drawings. Note that, the same reference numeral will be given to the same or corresponding portion in respective drawings, and redundant description will be omitted.

[Configuration of Scanning Device]

Figure 1:
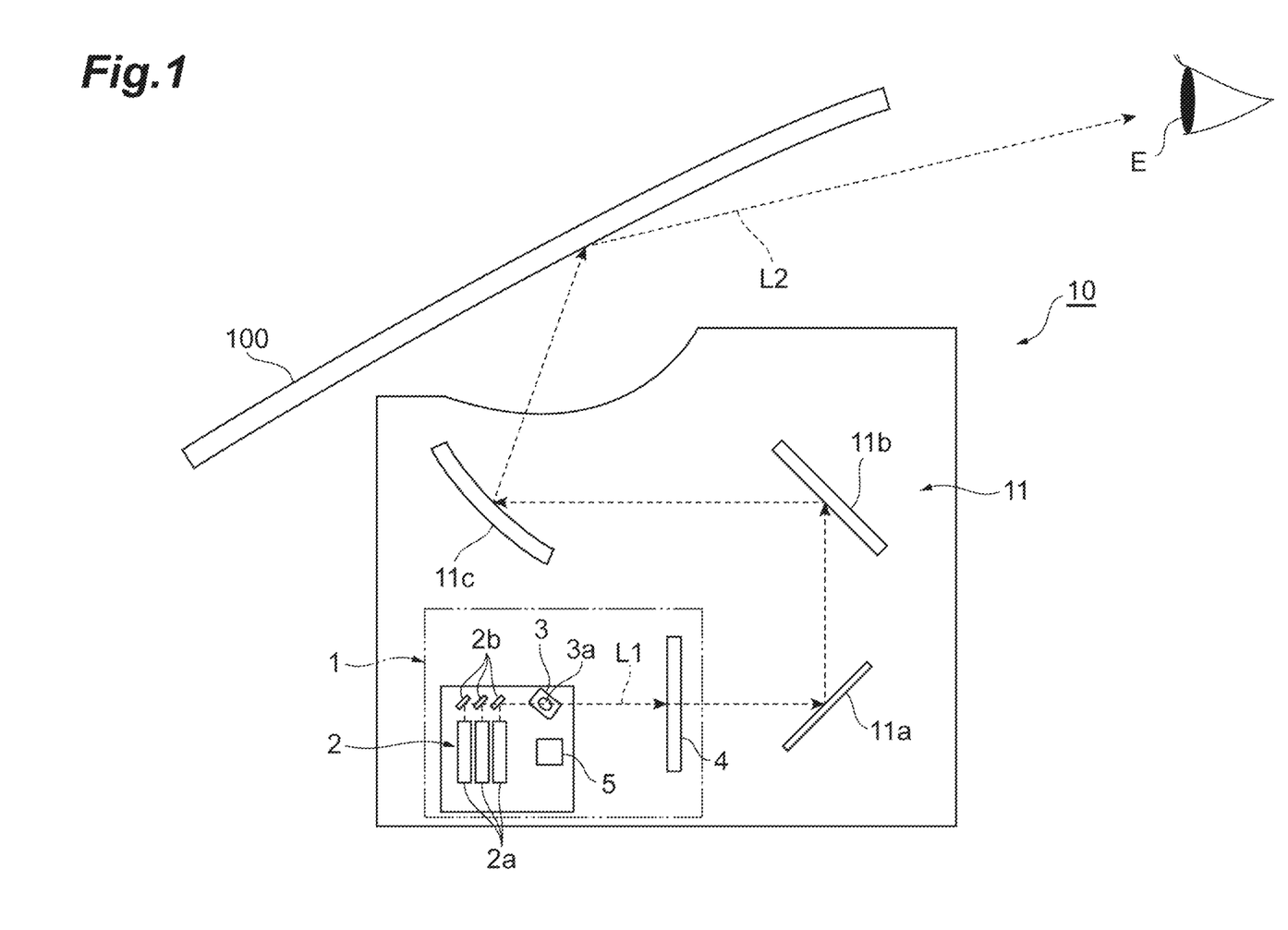
FIG. 1 is a configuration diagram of a scanning display system provided with a scanning device according to a first embodiment.

As illustrated in FIG. 1, for example, a scanning display system 10 is a laser scanning projection display that is mounted on a vehicle, and displays (projects and displays) an image to a windshield 100 of the vehicle. The scanning display system 10 includes a scanning device 1 and an optical system 11. The optical system 11 includes a plurality of planar mirrors 11*a* and 11*b*, a concave mirror 11*c*, and a windshield 100. The windshield 100 functions as an optical element on a rearmost stage in the optical system 11. Light L2 for projection display which is emitted from the scanning device 1 is sequentially reflected by the planar mirror 11*a*, the planar mirror 11*b*, the concave mirror 11*c*, and the windshield 100, and is incident to an eye E of an observer.

The scanning device 1 includes a light source 2, a MEMS mirror mechanism 3, a light diffusion unit 4, and a control unit 5. The light source 2 emits laser light L1 for projection display. More specifically, the light source 2 includes a plurality of light emission units 2*a*. For example, the plurality of light emission units 2*a* are a red laser diode, a green laser diode, and a blue laser diode, respectively. The light emission units 2*a* emits the laser light L1 having a wavelength in a visible region. The laser light L1 emitted from the light emission units 2*a* is reflected by a plurality of mirrors 2*b* including a dichroic mirror, proceeds on the same light path, and is incident to the MEMS mirror mechanism 3.

The MEMS mirror mechanism 3 includes a mirror 3*a* that reflects the laser light L1 emitted from the light source 2. The MEMS mirror mechanism 3 is a drive mirror manufactured by a MEMS (micro electro mechanical systems) technology, and a drive type of the MEMS mirror mechanism 3 is an electromagnetic drive type (details thereof will be described later). The MEMS mirror mechanism 3 scans the light diffusion unit 4 with the laser light L1 by swinging the mirror 3*a* with respect to a first axial line and a second axial line which are orthogonal to each other as a central line.

The light diffusion unit 4 diffuses the laser light L1 in the scanning by the MEMS mirror mechanism 3. For example, the light diffusion unit 4 is a transmission-type microlens array, and allows the laser light L1 in the scanning by the MEMS mirror mechanism 3 to be transmitted and diffuses the laser light L1. In the laser light L1 diffused by the light diffusion unit 4, light constituting an image is incident to the optical system 11 disposed on a rear stage of the light diffusion unit 4 as light L2 for projection display.

The control unit 5 controls the light source 2 and the MEMS mirror mechanism 3. As an example, when receiving an input signal indicating initiation of projection display, the control unit 5 initiates output of the light emission units 2a of the light source 2. According to this, the laser light L1 is emitted from the light source 2. At substantially the same time, the control unit 5 initiates an operation of the MEMS mirror mechanism 3. According to this, in the MEMS mirror mechanism 3, swinging of the mirror 3a is initiated, and the light diffusion unit 4 is scanned with the laser light L1 emitted from the light source 2. At this time, the control unit 5 changes a ratio of the laser light L1 emitted from each of the respective light emission units 2a in correspondence with a scanning position of the laser light L1 (a position of an irradiation region with the laser light L1) in the light diffusion unit 4. According to this, light L2 for projection display (that is, light constituting an image in the laser light L1 diffused by the light diffusion unit 4) is sequentially reflected by the planar mirror 11a, the planar mirror 11b, the concave mirror 11c, and the windshield 100, and is incident to the eye E of the observer.

[Configuration of MEMS Mirror Mechanism]

Figure 2:
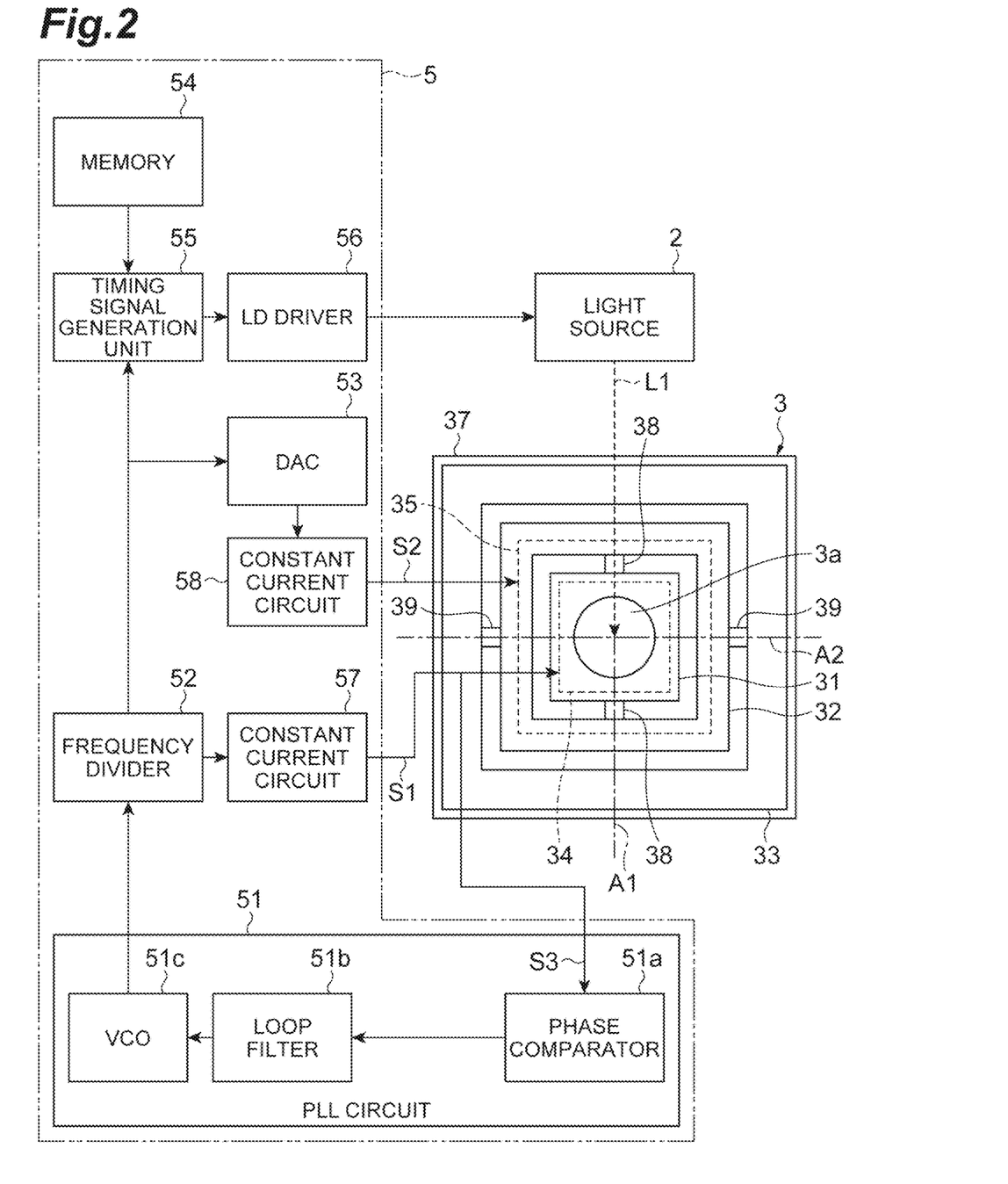
FIG. 2 is a configuration diagram of a MEMS mirror mechanism and a control unit of the scanning device illustrated in FIG. 1.

As illustrated in FIG. 2, the MEMS mirror mechanism 3 includes a first movable unit 31, a second movable unit 32, a support unit 33, a first drive coil 34, a second drive coil 35, and a magnet 37 in addition to the mirror 3a. The mirror 3a is provided in the first movable unit 31. The second movable unit 32 supports the first movable unit 31 to be swingable with respect to a first axial line A1 as a central line. The support unit 33 supports the second movable unit 32 to be swingable with respect to a second axial line A2 that intersects (here, that is orthogonal to) the first axial line A1 as a central line.

More specifically, the second movable unit 32 is formed in a frame shape to surround the first movable unit 31, and is connected to the first movable unit 31 through a pair of torsion bars 38 disposed on the first axial line A1. The support unit 33 is formed in a frame shape to surround the second movable unit 32, and is connected to the second movable unit 32 through a pair of torsion bars 39 disposed on the second axial line A2. The first movable unit 31, the second movable unit 32, the support unit 33, the pair of torsion bars 38, and the pair of torsion bars 39 are integrally formed, for example, by an SOT (silicon on insulator) substrate.

The first drive coil 34 is provided in the first movable unit 31. A first drive signal S1 for swinging the mirror 3a with respect to the first axial line A1 as a central line is input to the first drive coil 34 from the control unit 5, and an electromotive force signal S3 is output to the control unit 5 from the first drive coil 34. The second drive coil 35 is provided in the second movable unit 32. A second drive signal S2 for swinging the mirror 3a with respect to the second axial line A2 as a central line is input to the second drive coil 35 from the control unit 5. The magnet 37 generates a magnetic field acting on the first drive coil 34 and the second drive coil 35.

The first drive signal S1 is an electric signal that resonates the mirror 3a with respect to the first axial line A1 as a central line. When the first drive signal S1 is input to the first drive coil 34, a Lorenz force acts on the first drive coil 34 due to a mutual operation with the magnetic field generated by the magnet 37. In addition to the Lorenz force, when using resonance of the mirror 3a and the first movable unit 31 in a natural frequency, it is possible to resonate the mirror 3a with respect to the first axial line A1 as a central line. Note that, the natural frequency is determined by a mass of the mirror 3a and the first movable unit 31, a spring constant of the pair of torsion bars 38, and the like.

The second drive signal S2 is an electric signal for linearly operating the mirror 3a with respect to the second axial line A2 as a central line. When the second drive signal S2 is input to the second drive coil 35, a Lorenz force acts on the second drive coil 35 due to a mutual operation with the magnetic field that is generated by the magnet 37. It is possible to linearly operate the mirror 3a with respect to the second axial line A2 as a central line by using balance between the Lorenz force and an elastic force of the pair of torsion bars 39.

The electromotive force signal S3 is an electric signal for acquiring information relating to a vibration angle of the mirror 3a or the like. When the first movable unit 31 is swung in the magnetic field generated by the magnet 37, an electromotive force is generated in the first drive coil 34 provided in the first movable unit 31. The electromotive force corresponds to the electromotive force signal S3.

[Relationship Between First and Second Drive Signals and Frame]

Figure 3:
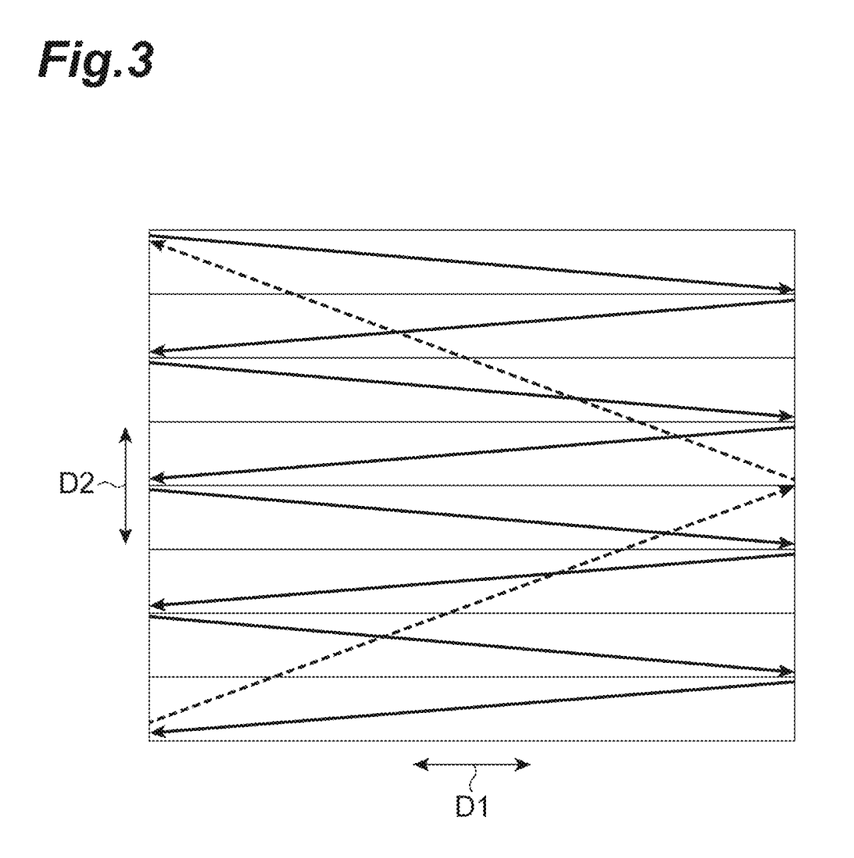
FIG. 3 is a view illustrating a scanning trajectory of laser light on a primary image plane of the scanning device illustrated in FIG. 1.

As illustrated in FIG. 2 and FIG. 3, the MEMS mirror mechanism 3 reciprocate an irradiation region of the laser light L in a horizontal direction (first direction) D1 by swinging the mirror 3a with respect to the first axial line A1 as a central line, and reciprocate the irradiation region of the laser light L in a vertical direction (second direction that intersects the first direction) D2 by swinging the mirror 3a with respect to the second axial line A2 as a central line. The control unit 5 generates the first drive signal S1 and the second drive signal S2 so that an image of one frame is formed by m times of reciprocation (m: an integer of two or greater) of the irradiation region of the laser light L1 in the horizontal direction D1 and one time of reciprocation of the irradiation region of the laser light L1 in the vertical direction D2.

Note that, FIG. 3 is a view illustrating a scanning trajectory of the laser light L1 on a primary image plane (here, a predetermined region in the light diffusion unit 4). In FIG. 3, a solid-line trajectory represents the scanning trajectory of the laser light L1 emitted from the light source 2. A broken-line trajectory represents a scanning trajectory of the laser light L1 in a case where the laser light L1 is not actually emitted from the light source 2, but the laser light L1 is assumed to be emitted. That is, in the scanning device 1, an image is formed by performing scanning with the laser light L1 so that a drawing period (lighting-on period: a period in which the control unit 5 causes the light source 2 to emit the laser light L1) and a returning period (lighting-off period: a period in which the control unit 5 does not cause the light source 2 to emit the laser light L1) are provided (details will be described later).

Figure 4:
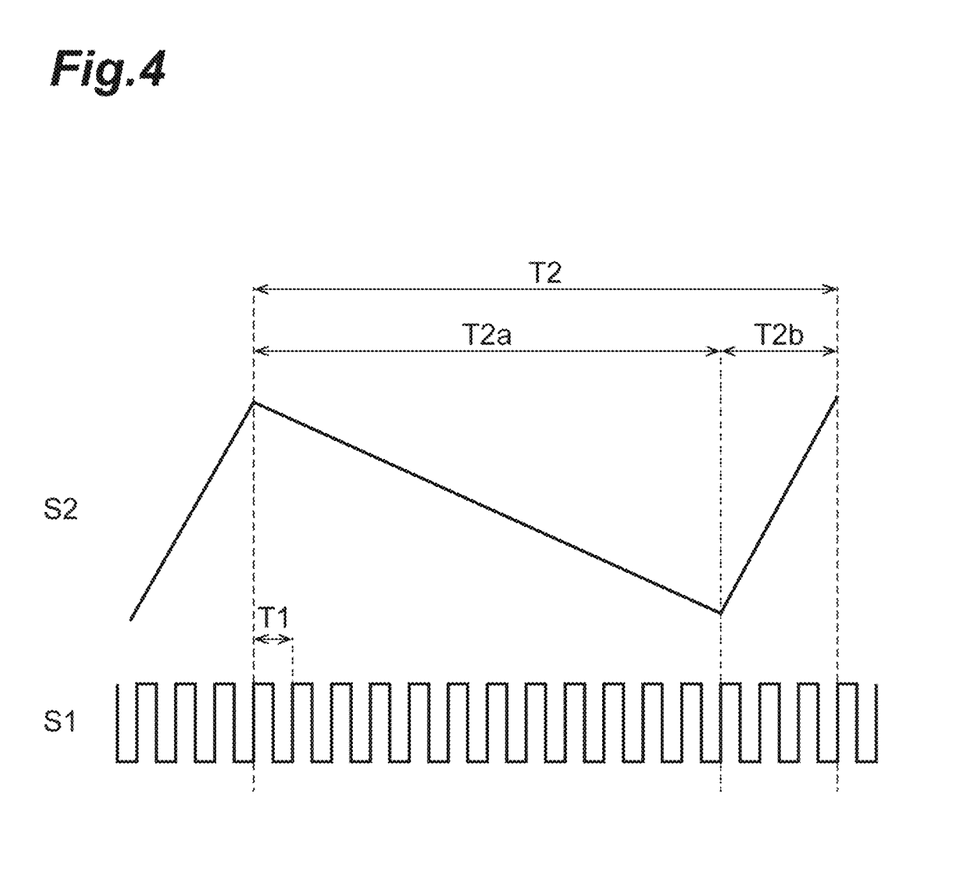
FIG. 4 is a view illustrating a relationship between a first drive signal and a second drive signal in the scanning device illustrated in FIG. 1.

As illustrated in FIG. 4, the first drive signal S1 is a rectangular wave in which one swing of the mirror 3a with respect to the first axial line A1 as a central line is set as one cycle T1. The second drive signal S2 is a triangular wave in which one swing of the mirror 3a with respect to the second axial line A2 as a central line is set as one cycle T2. In the second drive signal S2, in the one swing of the mirror 3a with respect to the second axial line A2 as a central line, an outgoing period T2a in which the mirror 3a rotates in one direction is longer than an incoming period T2b in which the mirror 3a rotates in a direction opposite to the one direction.

The outgoing period T2a of the second drive signal S2 corresponds to a period obtained by accumulating the one cycle T1 of the first drive signal S1 n times (n: an integer of two or greater). The laser light L1 is emitted from the light source 2 during the outgoing period T2a. That is, the outgoing period T2a is a drawing period in which the laser light L1 is emitted from the light source 2. The incoming period T2b of the second drive signal S2 corresponds to a period obtained by accumulating the one cycle T1 of the first drive signal S1 m-n times (m-n: an integer of one or greater and smaller than n (here, an integer of two or greater and smaller than n)). The laser light L is not emitted from the light source 2 during the incoming period T2b. That is, the incoming period T2b is a returning period for which the laser light L1 is not emitted from the light source 2. Note that, the scanning trajectory of the laser light L1 as illustrated in FIG. 3 is an example of a case where a relationship between the first drive signal S1 and the second drive signal S2 as illustrated in FIG. 4 is further simplified.

[Configuration of Control Unit]

As illustrated in FIG. 2, the control unit 5 includes a PLL (phase locked loop) circuit 51. The PLL circuit 51 includes a phase comparator 51a, a loop filter 51b, and a VCO (voltage controlled oscillator) 51c. The electromotive force signal S3 superimposed on the first drive signal S1 is input to the phase comparator 51a from the first drive coil 34. The phase comparator 51a changes a voltage in correspondence with a variation of a phase of the electromotive force signal S3, and outputs a signal in which a voltage is changed. The loop filter 51b removes a high-frequency component from the signal in which the voltage is changed by the phase comparator 51a, and outputs the signal from which the high-frequency component is removed. The VCO 51c changes a frequency in correspondence with a variation of a voltage in the signal from which the high-frequency component is removed by the loop filter 51b, and outputs the signal in which the frequency is changed.

The control unit 5 further includes a frequency divider 52, a D/A converter 53, and constant current circuits 57 and 58. The frequency divider 52 divides a frequency of the signal in which the frequency is changed by the VCO 51c, and inputs the frequency-divided signal to the first drive coil 34 as the first drive signal S1. At this time, the first drive signal S1 is converted into a current by the constant current circuit 57. The D/A converter 53 generates the second drive signal S2 on the basis of the signal in which the frequency is divided by the frequency divider 52, and inputs the generated second drive signal S2 to the second drive coil 35. At this time, the second drive signal S2 is converted into a current by the constant current circuit 58. In the MEMS mirror mechanism 3, a resonance frequency of the mirror 3a may vary due to a variation of an ambient temperature or the like. When the resonance frequency of the mirror 3a varies, a phase of the electromotive force signal S3 varies. Accordingly, the control unit 5 can modulate the frequency of the first drive signal S1 to conform to the resonance frequency of the mirror 3a by operating the PLL circuit 51 and the frequency divider 52 as described above.

The control unit 5 further includes a memory 54, a timing signal generation unit 55, and an LD driver 56. The memory 54 stores image information for projection display. The timing signal generation unit 55 reads out image information corresponding to a scanning position of the laser light L1 on the basis of the signal in which the frequency is divided by the frequency divider 52 from the memory 54, and transmits the read-out image information to the LD driver 56. The LD driver 56 controls the light source 2 so that the laser light L1 is modulated in correspondence with a scanning position of the laser light L1 (that is, so that a ratio of the laser light L1 emitted from each of the light emission units 2a varies in correspondence with the scanning position of the laser light L1).

Figure 5:
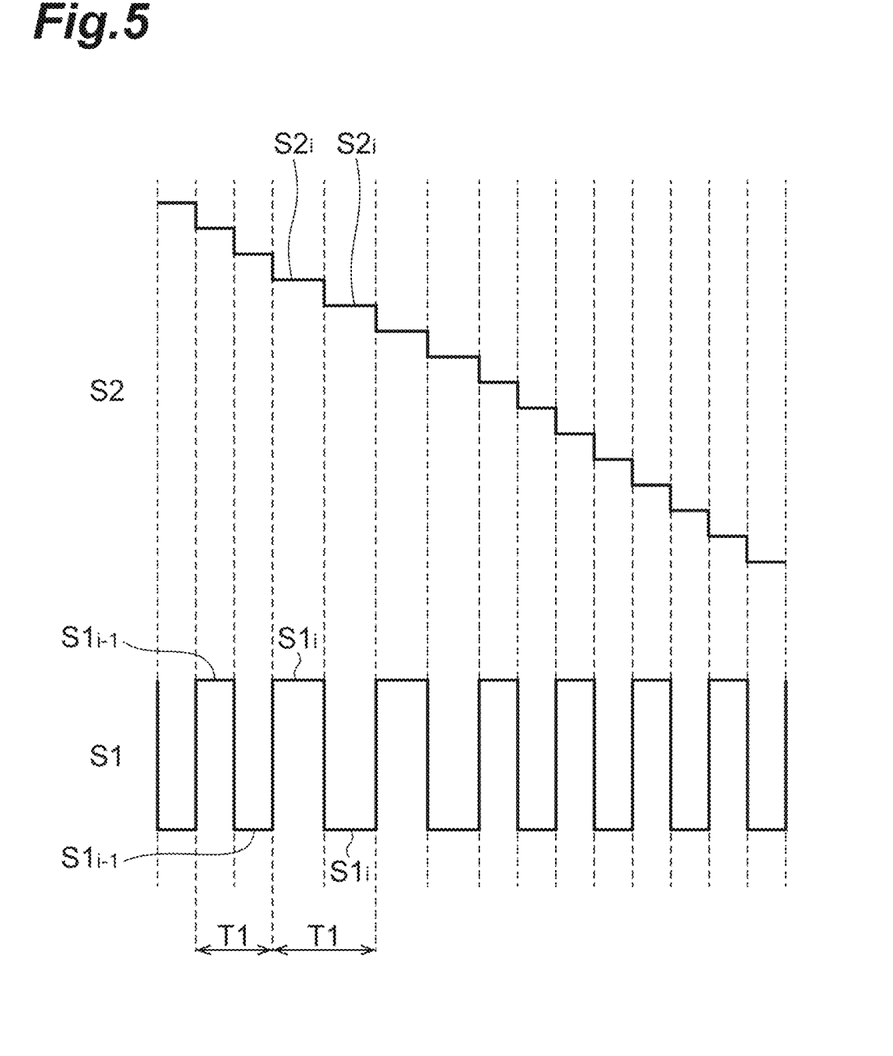
FIG. 5 is an enlarged view illustrating a relationship between the first drive signal and the second drive signal in the scanning device illustrated in FIG. 1.

Generation of the first drive signal S1 and the second drive signal S2 by the control unit 5 will be described in more detail. As illustrated in FIG. 5, the control unit 5 generates a second signal element $S2_i$ constituting the second drive signal S2 to correspond to a first signal element $S1_i$ in a current one cycle T1 in the first drive signal S1. More specifically, the control unit 5 generates the second signal element $S2_i$ constituting the second drive signal S2 corresponding to one cycle T1 to correspond to the first signal element $S1_i$ of ½ cycle in the current one cycle T1 in the first drive signal S1. Here, the control unit 5 sets the period of the first signal element $S1_i$ to be a period conforming to the resonance frequency of the mirror 3a on the basis of a variation of the phase of the electromotive force signal S3 with respect to the first signal element $S1_i$. According to this, the control unit 5 sets a period of the second signal element $S2_i$ to correspond to the first signal element $S1_i$, and sets a voltage value of the second signal element $S2_i$.

The control unit 5 may generate the second signal element $S2_i$ constituting the second drive signal S2 to correspond to a first signal element $S1_{i-1}$ in an immediately previous one cycle T1 (one cycle T1 before the current one cycle T1 by one cycle) in the first drive signal S1. More specifically, the control unit 5 generates the first signal element $S1_i$ of ½ cycle in the current one cycle T1 in the first drive signal S1 corresponding to one cycle T1 on the basis of the first signal element $S1_{i-1}$ of ½ cycle in the immediately previous one cycle T1 (may be the first signal element $S1_{i-1}$ of the first-half ½ cycle in the immediately previous one cycle T1, or may be the first signal element $S1_{i-1}$ of the second-half ½ cycle in the immediately previous one cycle T1) in the first drive signal S1. Here, the control unit 5 sets the period of the first signal element $S1_i$ to be a period conforming to the resonance frequency of the mirror 3a on the basis of a variation of a phase of the electromotive force signal S3 with respect to the first signal element $S1_{i-1}$. According to this, the control unit 5 generates the second signal element $S2_i$ constituting the second drive signal S2 corresponding to one cycle T1 to correspond to the first signal element $S1_i$. Here, the control unit 5 sets a period of the second signal element $S2_i$ to be the same period as in the first signal element $S1_i$, and sets a voltage value of the second signal element $S2_1$.

Note that, the control unit 5 generates the second signal element $S2_i$ to correspond to the first signal element $S1_i$ or $S1_{i-1}$ in a ½ cycle period in the first drive signal S1, but may generate the second signal element $S2_i$ to correspond to the first signal element $S1_i$ or $S1_{i-1}$ in an one cycle period in the first drive signal S1. The control unit 5 can generate the second signal element $S2_i$ to correspond to the first signal element $S1_i$ or $S1_{i-1}$ in a period equal to or less than one cycle in the first drive signal S1.

Figure 6:
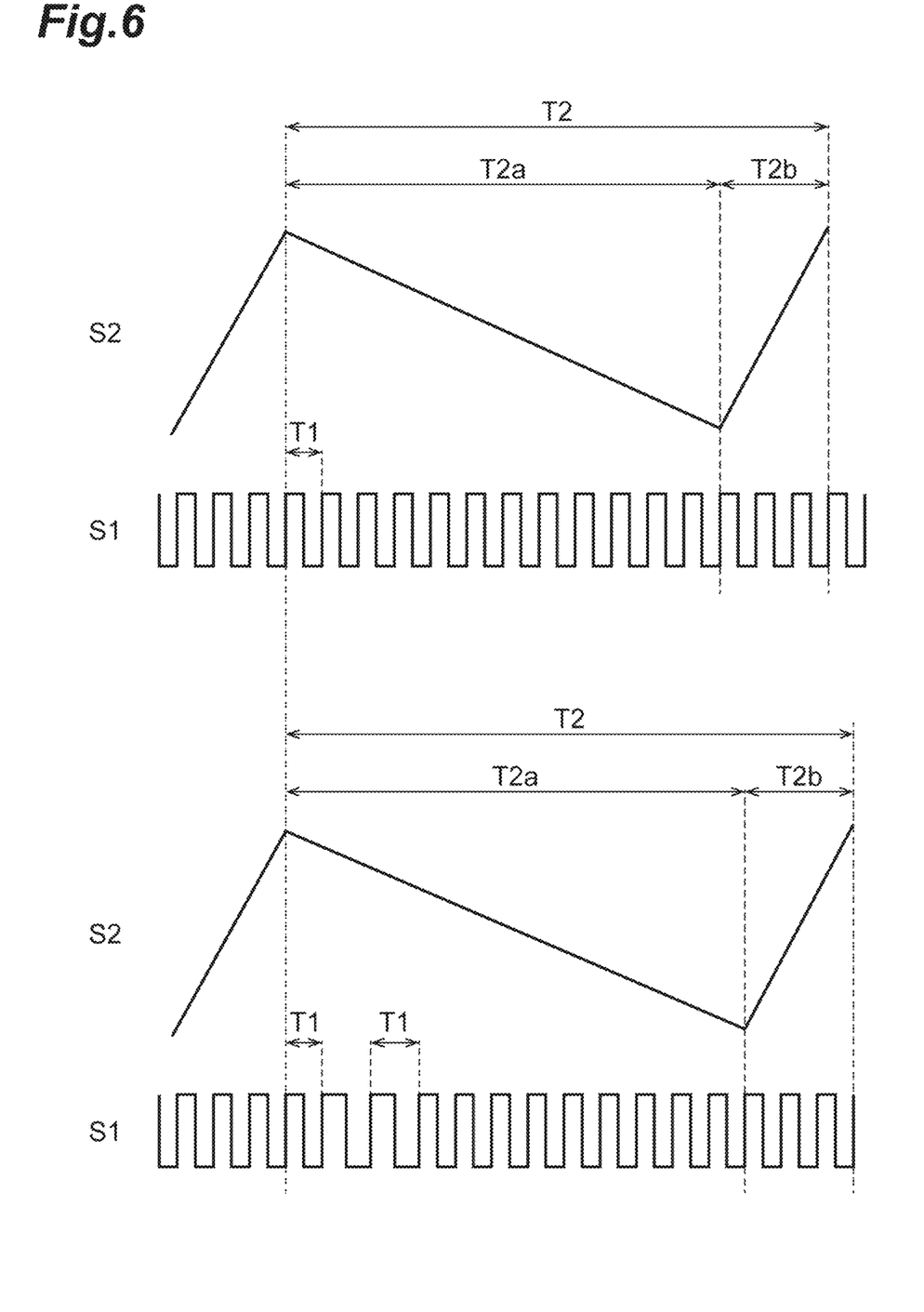
FIG. 6 is a view illustrating a relationship between the first drive signal and the second drive signal in the scanning device illustrated in FIG. 1.

The control unit 5 repeats generation of the first signal element $S1_i$, and generation of the second signal element $S2_i$ as described above in both the drawing period and the returning period while controlling the light source 2 (refer to FIG. 4) so that the outgoing period T2a corresponds to the drawing period and the incoming period T2b corresponds to the returning period. According to this, in a case where the period of the first signal element $S1_i$, is constant as illustrated in the upper part of FIG. 6, and in a case where the period of the first signal element $S1_i$, varies in one frame due to a variation of the resonance frequency of the mirror 3a as illustrated in the lower part of FIG. 6, a deviation does not occur in the corresponding relationship between the first drive signal S1 and the second drive signal S2. As described above, the control unit 5 repeats generation of the first signal element $S1_i$, and the second signal element $S2_i$ while fluctuating a frame rate (the number of frames processed per unit time).

Figure 7:
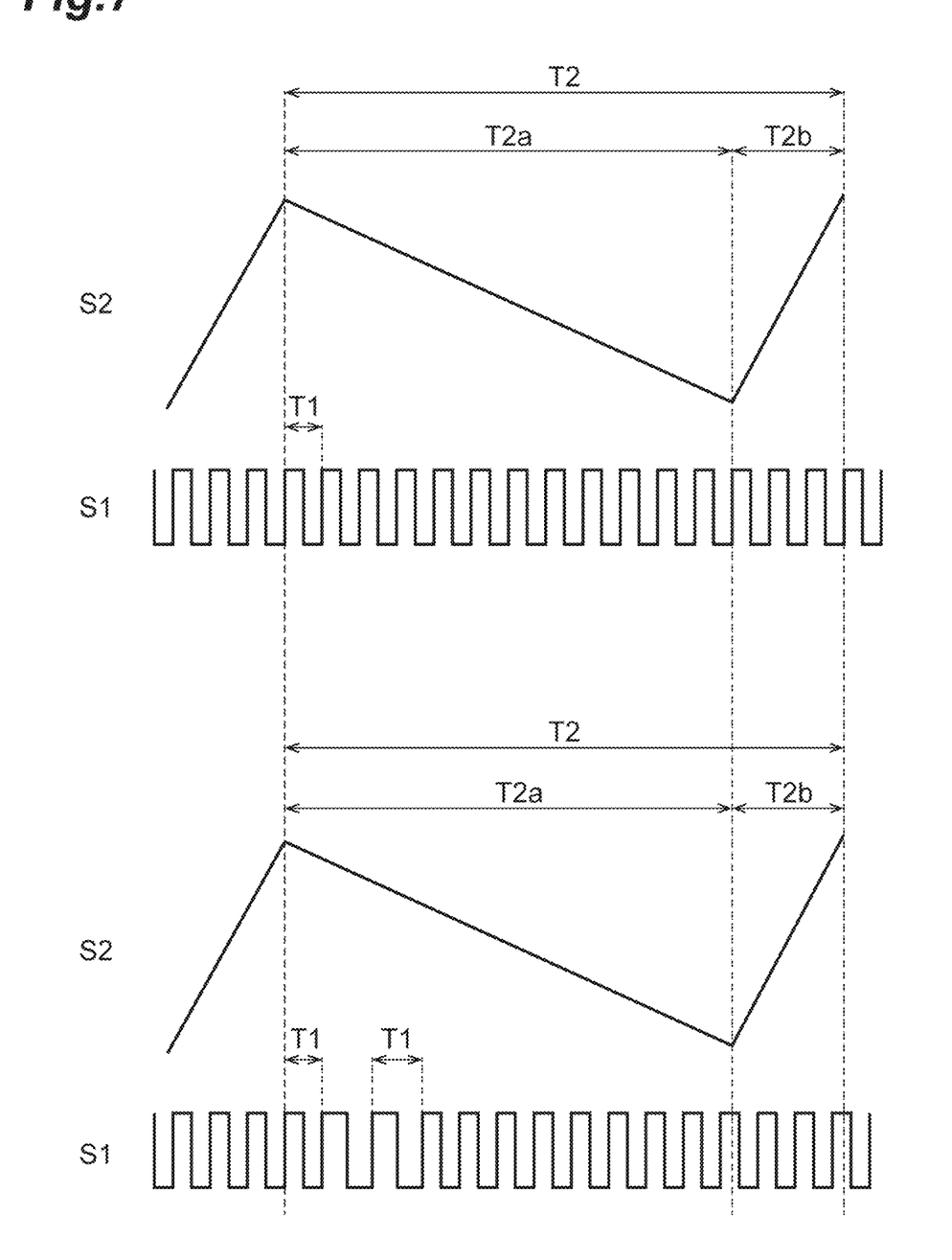
FIG. 7 is a view illustrating a relationship between a first drive signal and a second drive signal in a scanning device of a comparative example.

If generation of the first signal element $S1_i$ and generation of the second signal element $S2_i$ are not repeated in both the drawing period and the returning period, in a case where the period of the first signal element $S1_i$, is constant as illustrated in the upper part of FIG. 7, a deviation does not occur in the corresponding relationship between the first drive signal S1 and the second drive signal S2, but in a case where the period of the first signal element $S1_i$, varies in one frame due to the variation of the resonance frequency of the mirror 3a as illustrated in the lower part of FIG. 7, a deviation occurs in the corresponding relationship between the first drive signal S1 and the second drive signal S2.

[Operation and Effect]

In the scanning device 1, the first drive signal S1 and the second drive signal S2 are generated so that m times of reciprocation (m: an integer of two or greater) of the irradiation region of the laser light L1 in the horizontal direction and one time of reciprocation of the irradiation region of the laser light L1 in the vertical direction correspond to each other. More specifically, the second signal element $S2_i$ constituting the second drive signal S2 is generated to correspond to the first signal element $S1_i$, in a period equal to or less than one cycle period in the first drive signal S1. In addition, generation of the second signal element $S2_i$ is repeated in both the outgoing period T2a and the incoming period T2b in the one swing of the mirror 3a with respect to the second axial line A2 as a central line. According to this, even though the MEMS mirror mechanism 3 is influenced by a variation of an ambient temperature or the like, it is possible to suppress occurrence of a deviation in the corresponding relationship between the first drive signal S1 and the second drive signal S2. Accordingly, according to the scanning device 1, stable scanning with the laser light L1, and further, stable image display (for example, image display in which occurrence of a flicker phenomenon that occurs in a case as illustrated in the upper part of FIG. 7 is suppressed) become possible.

As described above, in a case where the control unit 5 generates the second signal element $S2_i$ to correspond to the first signal element $S1_i$ or $S1_{i-1}$ in a ½ cycle period in the first drive signal S1, or in a case where the control unit 5 generates the second signal element $S2_i$ to correspond to the first signal element $S1_i$ or $S1_{i-1}$ in an one cycle period in the first drive signal S1, it is possible to make a process when generating the second signal element $S2_i$ easy. In addition, in a case where the control unit 5 generates the second signal element $S2_i$ to correspond to the first signal element $S1_i$ in a current one cycle T1 in the first drive signal S1, or in a case where the control unit 5 generates the second signal element $S2_i$ to correspond to the first signal element $S1_{i-1}$ in an immediately previous one cycle T1 in the first drive signal S1, time delay when generating the second signal element $S2_i$ can be minimized. In addition, in a case where the control unit 5 generates the second signal element $S2_i$ to correspond to the first signal element $S1_i$ in the current one cycle T1 in the first drive signal S1, even when the resonance frequency of the mirror 3a varies in the middle of the first signal element $S1_i$ and the period of the first signal element $S1_i$ is shortened, it is possible to make the period of the second signal element $S2_i$ match the period of the first signal element $S1_i$ by determining the period of the second signal element $S2_i$ with reference to the electromotive force signal S3 corresponding to the first signal element $S1_i$.

In the scanning device 1, the first drive signal S1 is an electric signal for resonating the mirror 3a with respect to the first axial line A1 as a central line, the second drive signal S2 is an electric signal for linearly operating the mirror 3a with respect to the second axial line A2 as a central line, and the control unit 5 modulates the frequency of the first drive signal S1 to conform to the resonance frequency of the mirror 3a. According to this, even when the resonance frequency of the mirror 3a varies due to a variation of an ambient temperature or the like, it is possible to more reliably suppress occurrence of a deviation in the corresponding relationship between the first drive signal S1 and the second drive signal S2. Particularly, in the control unit 5, since the PLL circuit 51 is used, it is not necessary to separately provide a configuration for measuring the resonance frequency of the mirror 3a, and thus it is possible to realize reduction in size of the device and simplification of a configuration of the device.

In the scanning device 1, the control unit 5 controls the light source 2 so that the outgoing period T2a corresponds to the drawing period and the incoming period T2b corresponds to the returning period, and repeats generation of the second signal element $S2_i$ in both the drawing period and the returning period. In a case where the returning period is provided in the scanning with the laser light L1, since a temperature of the MEMS mirror mechanism 3 is lowered in the returning period in which the mirror 3a is not irradiated with the laser light L1, the resonance frequency of the mirror 3a is likely to fluctuate. Accordingly, in a case where the returning period is provided in the scanning with the laser light L1, repeating generation of the second signal element $S2_i$ as described above is particularly effective for suppressing occurrence of a deviation in the corresponding relationship between the first drive signal S1 and the second drive signal S2 in each drawing period. That is, since the first drive signal S1 and the second drive signal S2 correspond to each other even in the returning period, it is not necessary to adjust the deviation between the first drive signal S1 and the second drive signal S2 at the time of initiating the subsequent drawing period. In addition, when stopping the resonance operation of the mirror 3a in the returning period, it is difficult to promptly swing the mirror 3a at a high speed at the time of initiating the subsequent drawing period, and as a result, an image is blurred at the time of initiating the subsequent drawing period. In the scanning device 1, since the resonance operation of the mirror 3a is not stopped by providing the first drive signal S1 corresponding to a plurality of cycles in the returning period, the resonance operation of the mirror 3a becomes stable at the time of initiating the subsequent drawing period, and an image is not blurred at the time of initiating the subsequent drawing period.

In the scanning device 1, the electromagnetic drive type MEMS mirror mechanism 3 is used. In the electromagnetic drive type MEMS mirror mechanism 3, the resonance frequency of the mirror 3a is likely to vary due to a variation of a spring constant of the pair of torsion bars 38 due to a variation of an ambient temperature, a variation of a moment of inertia due to attachment of particles or the like, a variation of an attenuation coefficient of the pair of torsion bars 38 due to a variation of an atmospheric pressure, a variation of the spring constant of the pair of torsion bars 38 due to an operation of the second movable unit 32 with respect to the second axial line A2 as a central line, a variation of the spring constant and the attenuation coefficient of the pair of torsion bars 38 due to an aging variation of metal wires provided in the pair of torsion bars 38, or the like. The size of the MEMS mirror mechanism 3 is small, and thus fluctuation of the resonance frequency of the mirror 3a is more significant in comparison to a large-sized mirror mechanism such as a galvano mirror. Accordingly, in a case where the electromagnetic drive type MEMS mirror mechanism 3 is used, repeating generation of the second signal element $S2_i$ as described above is particularly effective for suppressing occurrence of a deviation in the corresponding relationship between the first drive signal S1 and the second drive signal S2 in each drawing period.

In the scanning device 1, the control unit 5 controls the light source 2 so that the laser light L1 is modulated in correspondence with a scanning position of the laser light L1. According to this, image display with higher quality is possible. Note that, when an absorption rate of the laser light L1 in the mirror 3a fluctuates due to modulation of the laser light L1, the resonance frequency of the mirror 3a fluctuates. Accordingly, in this case, repeating generating of the second signal element $S2_i$ as described above is particularly effective for suppressing occurrence of a deviation in the corresponding relationship between the first drive signal S1 and the second drive signal S2 in each drawing period.

In the scanning device 1, the control unit 5 repeats generation of the second signal element $S2_i$ while fluctuating the frame rate. According to this, it is possible to easily and reliably repeat generation of the second signal element $S2_i$. This is a finding found independently from a finding in the related art in which the frame rate is typically fixed, and enables stable image display.

Modification Example

The present disclosure is not limited to the one embodiment. For example, the light source 2 is not limited to a light source that uses a laser diode (semiconductor laser), and may be a light source that uses a surface-emitting laser, an SLD (super luminescent diode), or the like. In addition, a drive type of the MEMS mirror mechanism 3 is not limited to the electromagnetic drive type, and may be an electrostatic drive type, a piezoelectric drive type, a thermal drive type, or the like. In addition, the light diffusion unit 4 is not limited to the transmission type microlens array, and may be reflection type microlens array, a micro mirror array, a diffraction lattice, a fiber optic plate, or the like.

Figure 8:
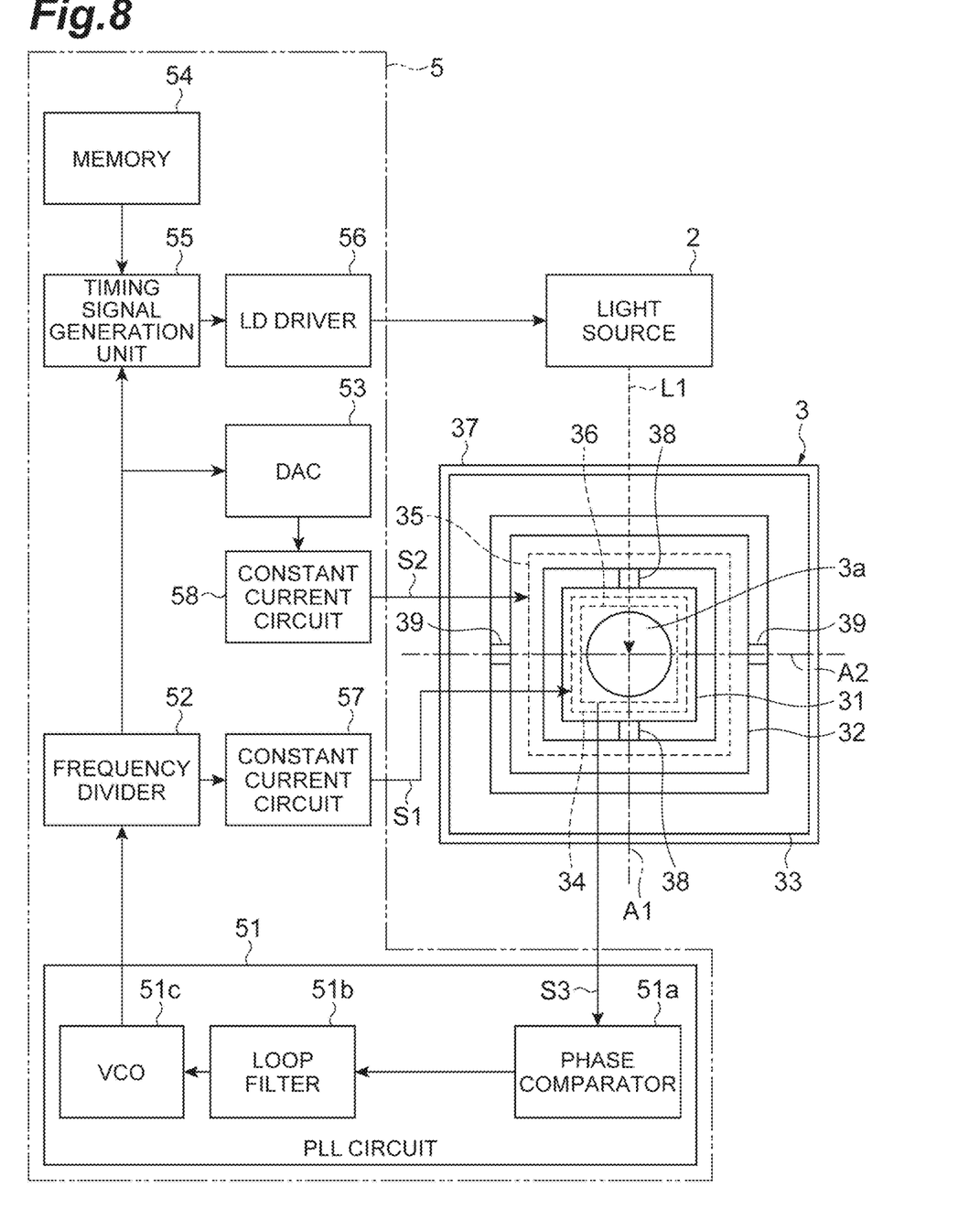
FIG. 8 is a configuration diagram of a modification example of the MEMS mirror mechanism and the control unit.

In addition, as illustrated in FIG. 8, the MEMS mirror mechanism 3 may further include an electromotive force monitoring coil 36. The electromotive force monitoring coil 36 is provided in the first movable unit 31 to be located on an inner side of the first drive coil 34. The electromotive force signal S3 is output to the control unit 5 (more specifically, the phase comparator 51a of the PLL circuit 51) from the electromotive force monitoring coil 36. When the first movable unit 31 is swung in the magnetic field generated by the magnet 37, an electromotive force is generated in the electromotive force monitoring coil 36 provided in the first movable unit 31. The electromotive force corresponds to the electromotive force signal S3. Even in this case, generation of any of the second signal element $S2_i$ is possible.

However, in the case of acquiring the electromotive force generated in the first drive coil 34 as the electromotive force signal S3, the following advantage is attained. That is, the first drive coil 34 is wound along an outer edge of the first movable unit 31 to swing the first movable unit 31 with high efficiency. In this case, a winding diameter of the first drive coil 34 increases, and thus a large electromotive force can be obtained even in a small number of turns. In addition, only a wire electrically connected to the first drive coil 34 passes through the torsion bars 38, and thus manufacturing of the MEMS mirror mechanism 3 can become easy.

In the MEMS mirror mechanism 3 illustrated in FIG. 2 and FIG. 8, the first drive coil 34 for swinging the first movable unit 31 is provided in the first movable unit 31 and the second drive coil 35 for swinging the second movable unit 32 is provided in the second movable unit 32, but the MEMS mirror mechanism 3 may be configured as follows. As an MEMS mirror mechanism 3 of a first modification example, a drive coil for swinging the first movable unit 31 and a drive coil for swinging the second movable unit 32 may be provided in the second movable unit 32. Alternatively, as an MEMS mirror mechanism 3 of a second modification example, a single drive coil for swinging the first movable unit 31 and the second movable unit 32 may be provided in the second movable unit 32.

In the MEMS mirror mechanism 3 of the first modification example and the MEMS mirror mechanism 3 of the second modification example, the electromotive force monitoring coil may be provided in the first movable unit 31, and in this case, the electromotive force signal S3 corresponding to an electromotive force corresponding to swinging of the first movable unit 31 may be output to the control unit 5 from the electromotive force monitoring coil. Alternatively, in the MEMS mirror mechanism 3 of the first modification example and the MEMS mirror mechanism 3 of the second modification example, the electromotive force monitoring coil may be provided in the second movable unit 32, and in this case, the electromotive force signal S3 corresponding to an electromotive force corresponding to swinging of the first movable unit 31 may be output to the control unit 5 from the electromotive force monitoring coil. In the MEMS mirror mechanism 3 of the first modification example and the MEMS mirror mechanism 3 of the second modification example, since the second movable unit 32 is vibrated by the drive coil provided in the second movable unit 32, and the vibration is transmitted to the first movable unit 31 to swing the first movable unit 31, even in a case where the electromotive force monitoring coil is provided in the second movable unit 32, it is possible to measure an electromotive force corresponding to the swinging of the first movable unit 31. Alternatively, in the MEMS mirror mechanism 3 of the first modification example and the MEMS mirror mechanism 3 of the second modification example, the electromotive force signal S3 corresponding to an electromotive force generated in the drive coil (that is, the drive coil provided in the second movable unit 32) in correspondence with swinging of the first movable unit 31 may be output to the control unit 5 from the drive coil.

In addition, the control unit 5 may control the light source 2 so that the outgoing period T2a corresponds to a first drawing period (a first lighting-on period: a period in which the control unit 5 causes the light source 2 to emit the laser light L1), and the incoming period T2b corresponds to a second drawing period (a second lighting-on period: a period in which the control unit 5 causes the light source 2 to emit the laser light L1), and may repeat generation of the second signal element $S2_i$ in both the first drawing period and the second drawing period. According to this configuration, in the first drawing period and the second drawing period, it is possible to suppress occurrence of a deviation in the corresponding relationship between the first drive signal S1 and the second drive signal S2. Note that, in this case, an image of two frames is formed by in times of reciprocation (in: an integer of two or greater) of an irradiation region of the laser light L1 in the horizontal direction, and one time of reciprocation of the irradiation region of the laser light L1 in a vertical direction. In addition, the second drive signal S2 in this case, for example, is a triangular wave in which the outgoing period T2$a$ and the incoming period T2$b$ are mutually equal to each other.

In addition, the first drive signal S1 may be a sinusoidal wave or the like without limitation to the rectangular wave as long as the first drive signal S1 is an electric signal in which one swing of the mirror 3$a$ with respect to the first axial line A1 as a central line is set as one cycle T1. In addition, the second drive signal S2 may be a sinusoidal wave or the like without limitation to the triangular wave as long as the second drive signal S2 is an electric signal in which one swing of the mirror 3$a$ with respect to the second axial line A2 as a central line is set as one cycle T2. In addition, in the second signal element S2$_i$ of the second drive signal S2, the voltage value may not be constant, and may increase or decrease.

In addition, a circuit that modulates the frequency of the first drive signal S1 to conform to the resonance frequency of the mirror 3$a$ may be a DDS (direct digital synthesizer) circuit or the like without limitation to the PLL circuit 51.

The control unit 5 may generate not only the first drive signal S1 in which a period varies from the first signal element S1$_i$ in which a period varies, but also the first drive signal S1 in which a period is constant from the first signal element S1$_i$ in which a period is constant. Even when the control unit 5 generates the first drive signal S1 in which the period is constant from the first signal element S1$_i$ in which the period is constant, a period of the first drive signal S1 input to the MEMS mirror mechanism 3 may vary due to a variation of the resonance frequency of the mirror 3$a$. Even in this case, according to the scanning device 1, the first drive signal S1 and the second drive signal S2 are generated so that m times of reciprocation of the irradiation region of the laser light L1 in the horizontal direction and one time of reciprocation of the irradiation region of the laser light L1 in the vertical direction correspond to each other.

In addition, the scanning device 1 may be used in various aspects such as a helmet-embedded type, an eyeglass type without limitation to the vehicle-mounted type. In addition, the scanning device of the present disclosure can be used in a distance image sensor. In the distance image sensor, a distance measurement region is scanned with laser light emitted from a scanning device, and laser light reflected from the distance measurement region is detected by a light detector. In the distance image sensor, a distance is measured with respect to respective sites in the distance measurement region that is scanned with the laser light on the basis of time until the laser light is detected with the light detector after the laser light is pulse-oscillated from a light source of the scanning device. A control unit of the scanning device which is used in the distance image sensor generates a first drive signal and a second drive signal so that in times of reciprocation (in: an integer of two or greater) of an irradiation region of the laser light in the first direction and one time of reciprocation of the irradiation region of the laser light in the second direction correspond to each other.

REFERENCE SIGNS LIST

1: scanning device, 2: light source, 3: MEMS mirror mechanism, 3 $a$: mirror, 5: control unit, 31: first movable unit, 32: second movable unit, 33: support unit, 34: first drive coil, 35: second drive coil (drive coil), 36: electromotive force monitoring coil, 37: magnet, A1: first axial line, A2: second axial line, D1: horizontal direction (first direction), D2: vertical direction (second direction), L1: laser light.

The invention claimed is:
1. A scanning device comprising:
a light source configured to emit laser light;
an MEMS mirror mechanism including a mirror configured to reflect the laser light emitted from the light source, the MEMS mirror mechanism being configured to reciprocate an irradiation region of the laser light in a first direction by swinging the mirror with respect to a first axial line as a central line, and reciprocate the irradiation region in a second direction that intersects the first direction by swinging the mirror with respect to a second axial line as a central line that intersects the first axial line; and
a control unit configured to generate a first drive signal for swinging the mirror with respect to the first axial line as a central line and a second drive signal for swinging the mirror with respect to the second axial line as a central line, and input the first drive signal and the second drive signal to the MEMS mirror mechanism,
wherein the first drive signal is an electric signal in which one swing of the mirror with respect to the first axial line as a central line is set as one cycle,
the second drive signal is an electric signal in which one swing of the mirror with respect to the second axial line as a central line is set as one cycle, and
the control unit is configured to generate a second signal element constituting the second drive signal to correspond to a first signal element in a period equal to or less than one cycle period in the first drive signal, and repeats generation of the second signal element in both an outgoing period and an incoming period in the one swing of the mirror with respect to the second axial line as a central line to generate the first drive signal and the second drive signal so that m times of reciprocation (m: an integer of two or greater) of the irradiation region in the first direction and one time of reciprocation of the irradiation region in the second direction correspond to each other.

2. The scanning device according to claim 1,
wherein the first drive signal is an electric signal for resonating the mirror with respect to the first axial line as a central line,
the second drive signal is an electric signal for linearly operating the mirror with respect to the second axial line as a central line, and
the control unit modulates a frequency of the first drive signal to conform to a resonance frequency of the mirror.

3. The scanning device according to claim 1,
wherein the control unit is configured to control the light source so that the outgoing period corresponds to a lighting-on period and the incoming period corresponds to a lighting-off period, and repeats generation of the second signal element in both the lighting-on period and the lighting-off period.

4. The scanning device according to claim 1, wherein the control unit is configured to control the light source so that the outgoing period corresponds to a first lighting-on period and the incoming period corresponds to a second lighting-on period, and repeats generation of the second signal element in both the first lighting-on period and the second lighting-on period.

5. The scanning device according to claim 1, wherein the control unit is configured to generate the second signal element to correspond to the first signal element in a ½ cycle period in the first drive signal.

6. The scanning device according to claim 1, wherein the control unit is configured to generate the second signal element to correspond to the first signal element in an one cycle period in the first drive signal.

7. The scanning device according to claim 1, wherein the control unit is configured to generate the second signal element to correspond to the first signal element in a current one cycle period in the first drive signal.

8. The scanning device according to claim 1, wherein the control unit is configured to generate the second signal element to correspond to the first signal element in an immediately previous one cycle period in the first drive signal.

9. The scanning device according to claim 1, wherein the MEMS mirror mechanism includes:
a first movable unit provided with the mirror;
a second movable unit configured to support the first movable unit to be swingable with respect to the first axial line as a central line;
a support unit configured to support the second movable unit to be swingable with respect to the second axial line as a central line;
a drive coil that is provided in the second movable unit; and
a magnet configured to generate a magnetic field acting on the drive coil.

10. The scanning device according to claim 1, wherein the light source is configured to emit the laser light for projection display, and
the control unit is configured to generate the first drive signal and the second drive signal so that an image of one frame or two frames is formed by the m times of reciprocation of the irradiation region in the first direction and the one time of reciprocation of the irradiation region in the second direction.

11. The scanning device according to claim 10, wherein the control unit is configured to control the light source so that the laser light is modulated in correspondence with a position of the irradiation region.

12. The scanning device according to claim 10, wherein the control unit is configured to repeat generation of the second signal element while fluctuating a frame rate.

13. A scanning device comprising:
a light source configured to emit laser light;
an MEMS mirror mechanism including a mirror configured to reflect the laser light emitted from the light source, the MEMS mirror mechanism being configured to reciprocate an irradiation region of the laser light in a first direction by swinging the mirror with respect to a first axial line as a central line, and reciprocate the irradiation region in a second direction that intersects the first direction by swinging the mirror with respect to a second axial line as a central line that intersects the first axial line; and
a control unit configured to generate a first drive signal for swinging the mirror with respect to the first axial line as a central line and a second drive signal for swinging the mirror with respect to the second axial line as a central line, and input the first drive signal and the second drive signal to the MEMS mirror mechanism,
wherein the first drive signal is an electric signal in which one swing of the mirror with respect to the first axial line as a central line is set as one cycle,
the second drive signal is an electric signal in which one swing of the mirror with respect to the second axial line as a central line is set as one cycle, and
the control unit is configured to generate a second signal element constituting the second drive signal to correspond to a first signal element in a period equal to or less than one cycle period in the first drive signal, and repeats generation of the second signal element in a lighting- on period in an outgoing period or an incoming period in the one swing of the mirror with respect to the second axial line as a central line to generate the first drive signal and the second drive signal.

14. The scanning device according to claim 13, wherein the first drive signal is an electric signal for resonating the mirror with respect to the first axial line as a central line,
the second drive signal is an electric signal for linearly operating the mirror with respect to the second axial line as a central line, and
the control unit modulates a frequency of the first drive signal to conform to a resonance frequency of the mirror.

15. The scanning device according to claim 13, wherein the control unit is configured to control the light source so that the outgoing period corresponds to a lighting-on period and the incoming period corresponds to a lighting-off period, and repeats generation of the second signal element in the lighting-on period.

16. The scanning device according to claim 13, wherein the control unit is configured to control the light source so that the outgoing period corresponds to a first lighting-on period and the incoming period corresponds to a second lighting-on period, and repeats generation of the second signal element in both the first lighting- on period and the second lighting-on period.

17. The scanning device according to claim 13, wherein the control unit is configured to generate the second signal element to correspond to the first signal element in a 1/2 cycle period in the first drive signal.

18. The scanning device according to claim 13, wherein the control unit is configured to generate the second signal element to correspond to the first signal element in an one cycle period in the first drive signal.

19. The scanning device according to claim 13, wherein the control unit is configured to generate the second signal element to correspond to the first signal element in a current one cycle period in the first drive signal.

20. The scanning device according to claim 13, wherein the control unit is configured to generate the second signal element to correspond to the first signal element in an immediately previous one cycle period in the first drive signal.

21. The scanning device according to claim 13, wherein the MEMS mirror mechanism includes:

a first movable unit provided with the mirror;

a second movable unit configured to support the first movable unit to be swingable with respect to the first axial line as a central line;

a support unit configured to support the second movable unit to be swingable with respect to the second axial line as a central line;

a drive coil that is provided in the second movable unit; and a magnet configured to generate a magnetic field acting on the drive coil.

22. The scanning device according to claim 13, wherein the light source is configured to emit the laser light for projection display, and the control unit is configured to generate the first drive signal and the second drive signal so that an image of one frame or two frames is formed by the m times of reciprocation of the irradiation region in the first direction and the one time of reciprocation of the irradiation region in the second direction when m times of reciprocation (m: an integer of two or greater) of the irradiation region in the first direction and one time of reciprocation of the irradiation region in the second direction correspond to each other.

23. The scanning device according to claim 22, wherein the control unit is configured to control the light source so that the laser light is modulated in correspondence with a position of the irradiation region.

24. The scanning device according to claim 22, wherein the control unit is configured to repeat generation of the second signal element while fluctuating a frame rate.

* * * * *